Figure 1:
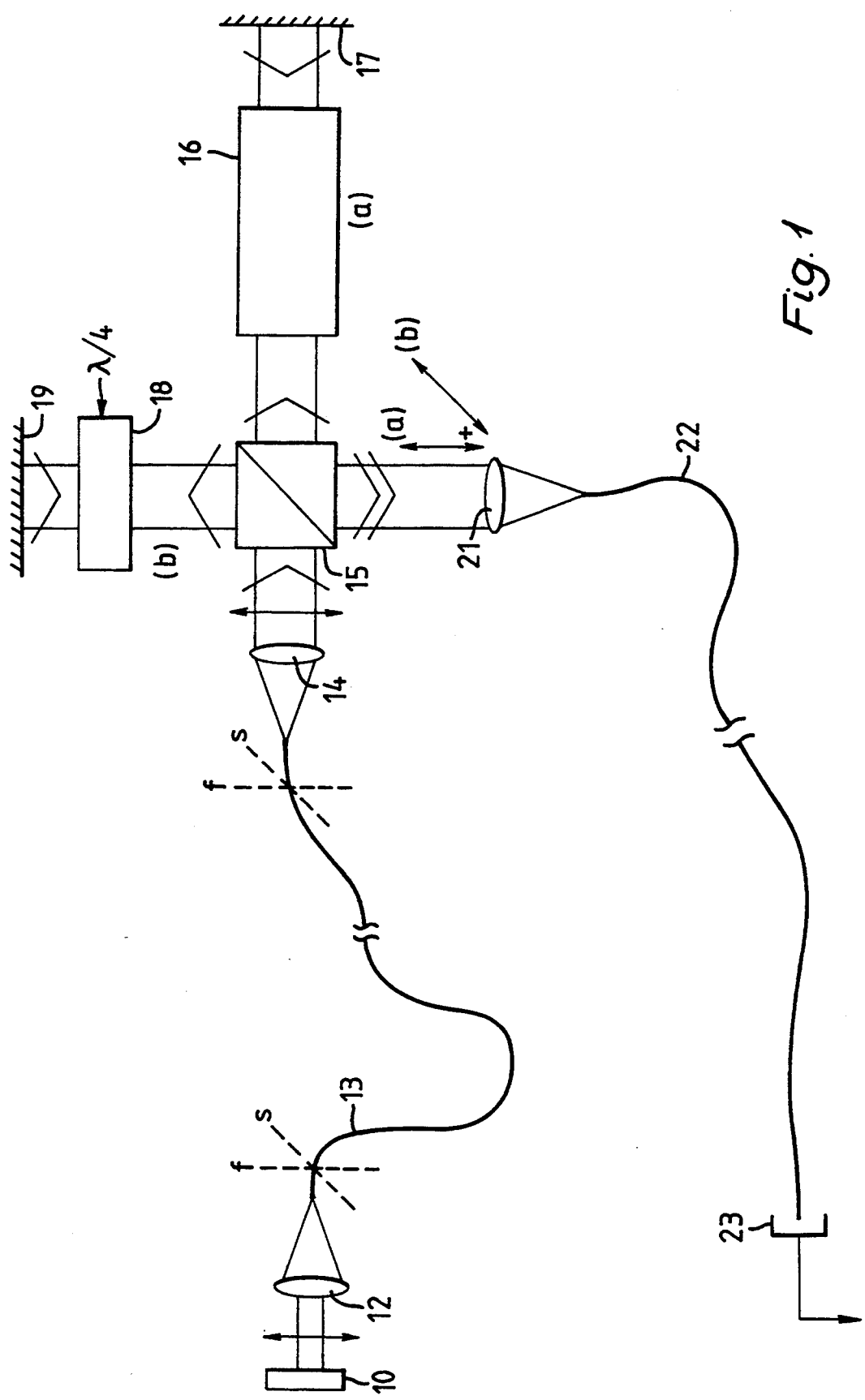

United States Patent [19]

Tatam

[11] Patent Number: 5,450,006
[45] Date of Patent: Sep. 12, 1995

[54] APPARATUS AND METHODS FOR MEASURING MAGNETIC FIELDS AND ELECTRIC CURRENTS

[75] Inventor: Ralph P. Tatam, Grendon, England

[73] Assignee: British Technology Group Limited, London, England

[21] Appl. No.: 108,631

[22] PCT Filed: Mar. 6, 1992

[86] PCT No.: PCT/GB92/00403

§ 371 Date: Aug. 30, 1993

§ 102(e) Date: Aug. 30, 1993

[87] PCT Pub. No.: WO92/15895

PCT Pub. Date: Sep. 17, 1992

[30] Foreign Application Priority Data

Mar. 7, 1991 [GB] United Kingdom ............... 9104780

[51] Int. Cl.$^6$ .............................................. G02F 1/01
[52] U.S. Cl. .................................. 324/96; 324/244.1; 324/117 R; 250/227.14; 250/227.17; 356/345
[58] Field of Search ............ 324/96, 244.1, 117 R; 356/345, 351, 352; 250/227.14, 227.17

[56] References Cited

U.S. PATENT DOCUMENTS

| | | | |
|---|---|---|---|
| 4,560,867 | 12/1985 | Papuchon | 250/225 |
| 4,563,639 | 1/1986 | Langeac | 324/96 |
| 4,613,811 | 9/1986 | Vaerewyck et al. | 324/96 |
| 4,803,429 | 2/1989 | Kyuma et al. | 324/244 |
| 5,218,419 | 6/1993 | Lipson | 356/345 |

FOREIGN PATENT DOCUMENTS

| | | |
|---|---|---|
| 43143 | 12/1985 | Australia . |
| 0079268 | 5/1983 | European Pat. Off. . |
| 2164145 | 3/1986 | United Kingdom . |

OTHER PUBLICATIONS

Optics Communications, vol. 72, Jul. 1, 1989, Amsterdam, NL, pp. 60–65; R. P. Tatam et al.
Electronics Letters, vol. 21, No. 11, May 1985, Stevenage GB, pp. 464–466, A. D. Kersey et al.
Sixth Topical Meeting on Optical Fiber Communication, Feb. 28–Mar 2, 1983, OSA/IEEE New Orleans, Digest of Technical Papers, pp. 40–41, Y. Tsujimoto et al.
Patent Abstracts of Japan, vol. 8, No. 086 (p-269) Apr. 1984, & JP,A,59 000 659 (Hitachi Seisakusho KK) 5 Jan. 1984.
Patent Abstract of Japan, vol. 13, No. 209 (p-871) 17 May 1989 & JP,A,01 026 168 (Matsushita Electric Ind Co.) 27 Jan. 1989.
Patent Abstracts of Japan, Pub. No. 59000659, Apr. 1984, vol. 8, No. 86 (P269) re JP-A-57110019.
Patent Abstracts of Japan, Pub. No. 01026168, May 1989, vol. 13, No. 209 (P871) re JP-A-62182511.
Risk et al., "Fiber-optic frequency shifter using a surface acoustic wave incident at an oblique angle", Optical Society of America, 1986, pp. 115–117.
Tatam et al., "Faraday effect magnetomrtry utilizing high Verdet constant glass", Appl. Phys. Lett., Sep. 1987, pp. 864–867.
Shiraishi et al., "Fiber Faraday rotator", Applied Optics, Apr. 1984, pp. 1103–1107.

*Primary Examiner*—Kenneth A. Weider
*Assistant Examiner*—Mark Wardas
*Attorney, Agent, or Firm*—Cushman, Darby & Cushman

[57] ABSTRACT

Apparatus for sensing or measuring a magnetic field comprises a light source (10) for generating light having at least a component which is polarized, a sensing element (16) arranged to transmit light from the source and comprising material having a substantial Verdet constant which depends on the temperature of the material, means (14–19, 21) for combining light from the source with light from the sensing element to form an interference pattern, means (23) for providing a signal representative of the intensity of the light so combined, and means for deriving first and second signals dependent on the Verdet constant of the material and the temperature thereof, respectively, from the signal representative of light intensity, whereby the intensity of the magnetic field at the element, substantially independent of temperature, can be derived. The invention extends to a method of sensing or measuring magnetic field intensity, and to apparatus and a method for sensing or measuring electric current.

23 Claims, 2 Drawing Sheets

APPARATUS AND METHODS FOR MEASURING MAGNETIC FIELDS AND ELECTRIC CURRENTS

BACKGROUND OF THE INVENTION

The present invention relates to apparatus and a method for sensing or measuring magnetic fields and hence also to apparatus and a method for sensing or measuring electric current. Temperature may also be measured. A particular application is in measuring high fault currents in electrical power and distribution systems. The invention could, for example, be used in mapping magnetic fields around high power transmitters or for condition monitoring in electrical machinery.

Considerable research has been carried out into the use of the Faraday effect, which is described below, in measuring large electrical currents. Measurement depends on the Verdet constant $V(\lambda,T)$ which is both dispersive and temperature dependent. Most techniques have concentrated on single mode optical fiber as the sensing element because of its well-known desirable properties; electrical isolation, flexibility, linear response, large bandwidth and zero hysteresis. However, optical fibers still suffer from several serious problems. Firstly, environmental birefringence perturbations, the most serious of which arises from vibration, which causes changes in the state of polarization (SOP) of the optical beam with concomitant sensitivity and scale factor fluctuations. Various techniques have been investigated to reduce this effect including the use of very low intrinsic birefringent fiber, the development of spun high birefringence fiber, the use of jelly filled cabling to mechanically isolate the optical fiber and the deployment of low birefringence fiber in a helical configuration to take advantage of geometrical birefringence effects. These techniques have met with varying degrees of success, but all suffer from varying problems. A major problem Is the low Verdet constant of silica fibers ($\sim 5\times 10^{-6}$ rad $A^{-1}$) which then requires many turns of fiber to increase the sensitivity. However, this then leads to greater birefringence in the fiber introduced when the fiber is deployed in a loop around the current carrying conductor, and hence larger diameter loops are required; the birefringence is proportional to $(1/R^2)$ where R is the loop radius. In addition this technique cannot be used for small sensing elements, for example localized sensors for mapping magnetic fields around high power transmitters or for condition monitoring in electrical machinery. Optical fiber has recently been employed as the sensing element in constructing an electric current sensor for fault protection, up to 60 KA, on a 145 KV power line. However, the loop diameter is $\sim 1$ m and up to 7 turns of fiber are required to give the required dynamic range. This technique is inappropriate for the smaller sensing configurations mentioned previously, and where lower currents, 1 to 1000A, are required; the reduction in coil diameter combined with the increase in the number of fiber loops required would induce a serious degree of linear birefringence thus degrading the SOP of the light in the sensing element with a concomitant reduction in measurement sensitivity and with increased environmental sensitivity.

Techniques to increase the sensitivity, and thus allow smaller and easier methods to deploy sensors, have been investigated based predominantly on using materials which exhibit higher Verdet constants. Generally, these have been glass blocks made from flint or lead glass (see: T. Yoshino, "Optical fiber sensors for electric industry", SPIE, 586, 30, 1985; and Y. Kuroda, Y. Abe, H. Kuwahara and K. Yoshinaga, "Field test of fiber-optic voltage and current sensors applied to gas insulated substation", SPIE, 586, 30, 1985) with limited investigation of FR-5 glass (See: R. P. Tatam and D. A. Jackson, "Remote probe configuration for Faraday effect megnetometry", Optics commun. 72, 60, 1989). FR-5 has a Verdet constant of $\sim 10^{-4}$ rad $A^{-1}$, typically 20 times greater than silica fiber. It is a glass doped with paramagnetic Nd ions and therefore $V(\lambda, T)$ follows a $1/T$ dependence; silica based optical fiber and flint glass are diamagnetic materials and consequently the temperature dependence of $V(\lambda, T)$ Is negligible. This temperature dependence of $V(\lambda, T)$ for paramagnetic based sensing elements causes severe problems as changes in the recovered Faraday signal due to temperature changes are indistinguishable from changes in the electric current/magnetic field, i.e. the scale factor is temperature dependent. For example, for an operating temperature range of $-20°$ C. to $+60°$ C. the Verdet constant for FR-5 changes by $\sim 30\%$. Fault protection requirements require $\sim 5\%$ accuracy and metering 0.1 to 1% accuracy and therefore temperature compensation is essential. Previous research has concentrated on signal processing techniques associated with recovering the Faraday signal and the techniques developed have significantly improved methods of deployment, allowing remote operation of sensing elements, as well as overcoming problems associated with 'down-lead' sensitivity and operating point drift. However, the temperature sensitivity was not addressed in these investigations. Several techniques for temperature compensation have been proposed based on the sensing element experiencing a permanent d.c. magnetic field component. The major disadvantage with these techniques is the requirement for permanent magnets to be positioned at the sensing element, thus requiring shielding from the very high magnetic fields present. In addition such techniques would be impractical with high Verdet constant optical fiber since large diameter and long length magnets would be required. Another proposed technique uses a bimetallic coil to mechanically rotate the sensing element thus increasing or decreasing the effective magnetic field component acting on the sensing element. This technique requires the sensing element to be mounted in a complex mechanical assembly which is able to rotate over $\sim 30°$ and is therefore unattractive for ease of installation and long term reliability. According to a first aspect of the present invention there is provided apparatus for sensing or measuring a magnetic field comprising a light source for generating light having at least a component which is polarized, a sensing element arranged to transmit light from the source and comprising material having a Verdet constant which depends on the temperature of the material, means for combining light from the source with light from the sensing element to form an interference pattern, means for providing a signal representative of the intensity of light so combined, and means for deriving first and second signals dependent on the Verdet constant of the material and the temperature thereof, respectively, from the signal representative of light intensity, whereby the intensity of the magnetic field at the element, substantially independent of temperature, can be derived.

Preferably the means for combining is a Michelson interferometer and the sensing element is a high Verdet constant material in the form of a glass block or optical fiber, for example. The use of such materials allows a higher sensitivity and smaller size sensing element. However, in some circumstances a specific material, such as a particular optical fiber, may have certain advantages even though it has a relatively low Verdet constant. Such materials may be used according to the invention where the Verdet constant is temperature dependent.

The technique is completely passive and requires only the sensing element to be placed in the measurement field; permanent magnets and mechanical compensation are not required.

The apparatus of the first aspect of the invention may include means for deriving a signal representative of the magnetic field at the element from the first and second signals.

To simplify signal processing the apparatus may include means for modulating, with the said light intensity, a carrier signal such as can be generated, for example, by cyclically varying either the frequency of the light or the length of one of the interferometer arms. Means for demodulating the carrier signal may then be used to derive the first signal which varies according to the Faraday effect and temperature, and the second signal which is dependent on temperature but not the Faraday effect.

The sensing element of the invention is completely passive and optical links between the interferometer and both the light source and an optical sensor, forming part of the means for sensing light intensity and change in phase, are preferably by way of a high birefringence monomode fiber and a multimode fiber, respectively, allowing remote deployment of the sensing element. Environmental perturbation of these fiber links should not give rise to signal degradation. The small size and undistorted nature of its deployment, when not bent to form a loop, should result in significantly smaller susceptibility of the sensing element to environmental perturbations, particularly vibration, that give rise to signal fading and scale factor changes.

According to a second aspect of the invention there is provided a method of sensing or measuring magnetic field intensity comprising the steps of generating light having at least one component which polarized, transmitting the light generated through a sensing element in the magnetic field, the sensing element comprising material having a Verdet constant which depends on the temperature of the material, combining light from the source with light from the sensing element to form an interference pattern, providing a signal representative of the intensity of light so combined, and deriving first and second signals dependent on the Verdet constant of the material and the temperature thereof, respectively, from the signal representative of light intensity, whereby the intensity of the magnetic field at the element, substantially independent of temperature, can be derived.

When polarized light is transmitted by a dielectric element in a magnetic field it experiences Faraday rotation. The Faraday effect is the rotation of the azimuth, $\phi_F$, of a plane of polarized light in the presence of a magnetic field component, H, parallel to the direction of propagation of the light and is given by $$\phi_F = V(\lambda, T) \oint H . dL \qquad \text{equation 1,}$$

where $V(\lambda, T)$ is the material dependent Verdet constant, which is both dispersive and temperature (T) dependent, $\lambda$ is the wavelength of the light and L is the interaction length.

If the dielectric element is used as a sensing element and forms part of a Michelson interferometer illuminated by linearly polarized light coupled from the source to the interferometer using high birefringence fiber then conventional Michelson fringes are formed at the output. The transfer function for a Michelson interferometer may be written $$I \propto (I_1 + I_2)(1 + \nu \cos \Delta\Phi) \qquad \text{equation 2,}$$

where I is the observed intensity, $I_1$ and $I_2$ are the optical intensities in the two paths of the interferometer, $\nu$ is the visibility and $\Delta\Phi$ is the phase difference between the two recombining optical beams.

In equation 2 the visibility $\nu$ depends on $I_1$, $I_2$, the coherence length of the source and the relative state of polarization (SOP) of the two recombining beams. From equation 1 the relative SOP depends on both intensity of the magnetic field and temperature but phase difference, $\Delta\Phi$, that is the phase of the output fringes, depends only on temperature. Temperature change in the sensing element alters the optical path length, predominantly by means of a change in the refractive index, and hence varies $\Delta\Phi$. Thus a measurement of this phase change gives direct information on temperature change occurring in the sensing element independent of the applied magnetic field. This temperature information is used to calculate the Verdet constant and allows the Faraday rotation to be used for magnetic field measurement if compensated for temperature changes of the sensing element.

Certain embodiments of the invention will now be described by way of example with reference to the accompanying drawings, in which:-

Figure 2:
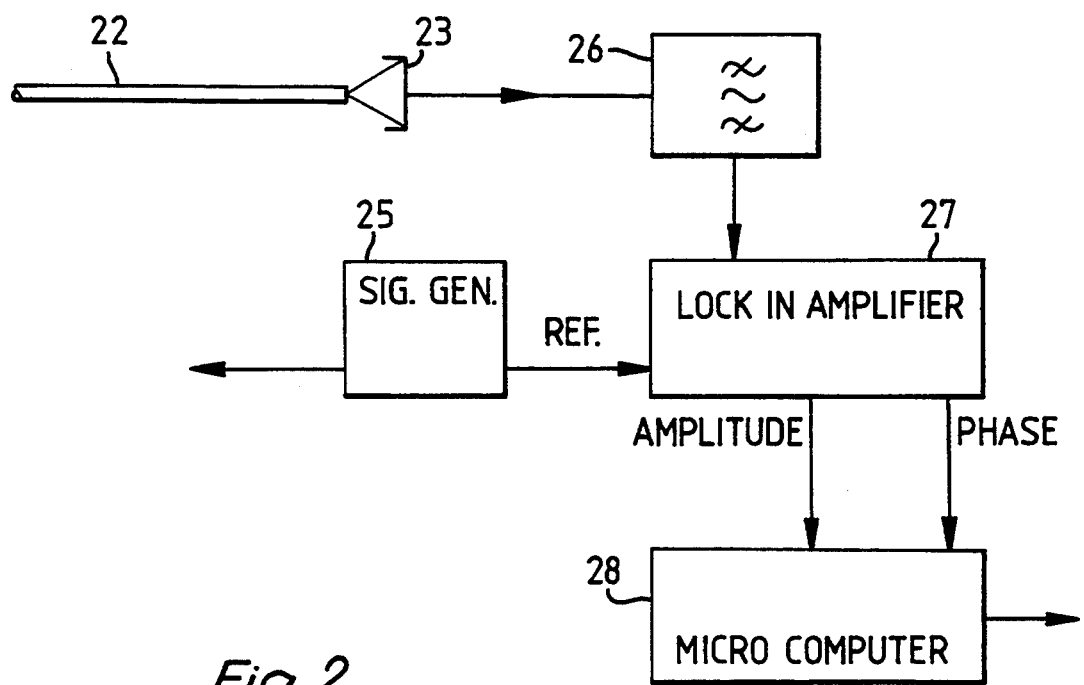
Figure 3:
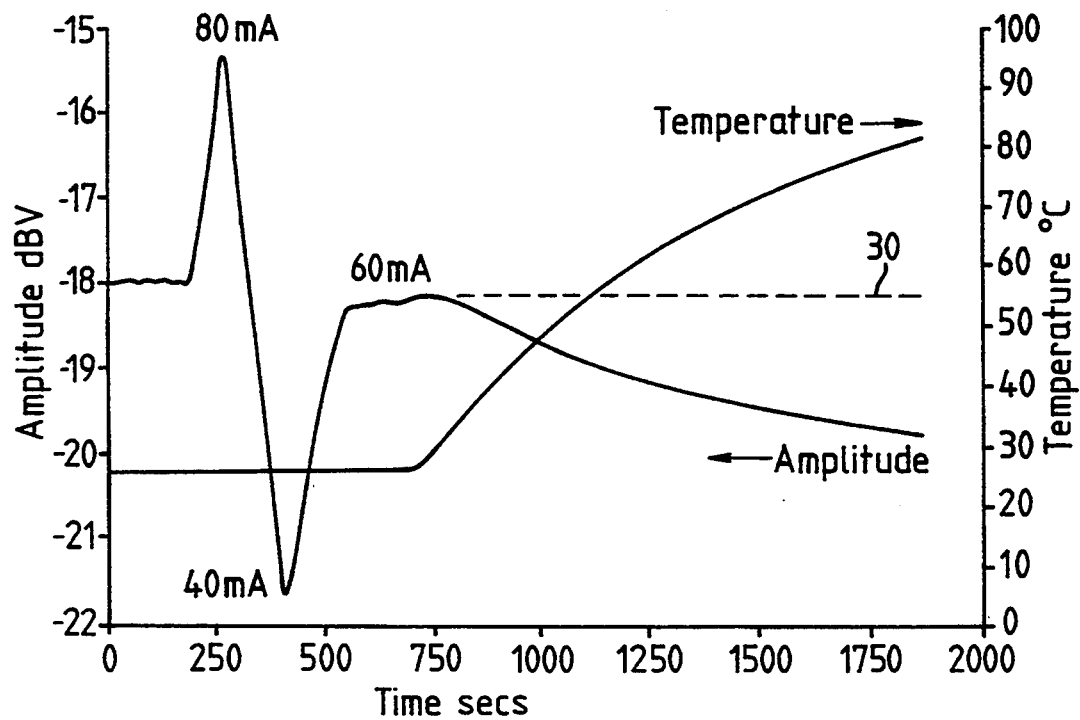

FIG. 1 is a schematic diagram of an optical arrangement for apparatus according to the invention, FIG. 2 is a schematic diagram of signal processing apparatus for use with the arrangement of FIG. 1, and FIG. 3 is a graph showing the relationship between temperature and a temperature dependent signal derived according to the invention.

FIG. 1 a coherent light source 10 projects linearly polarized light through a lens 12 into a high-birefringence optical fiber 13 which preserves the polarization of the light. Light emerging from the fibre 13 passes through another lens 14 to a beam splitter 15 having one output beam which passes to a Faraday sensing element 16 and then by way of a mirror 17 back through the Faraday sensing element 16 to the beam splitter 15. The other beam from the splitter 15 passes through a quarter wave plate 18 to another mirror 19 where it is reflected back through the quarter wave plate to the beam splitter 15. The Faraday sensing beams from the element 6 and the quarter wave plate 18 are combined by the beam splitter 15 and pass through a lens 21 into a multimode fiber 22 and then to an optical detector 23. It will be appreciated that the beam splitter 15, Faraday sensing element 16, mirror 17, quarter wave plate 18 and mirror 19 together constitute a Michelson interferometer.

The Faraday sensing element 16 employs a material which exhibits a high Verdet constant. Such elements may be glass blocks or fibers made from flint or lead glass. A suitable sensing element is a rod made from commercially available FR-5 glass. Other possibilities for suitable blocks or fibers include TGG (terbium-gallium-garnet) which has a Verdet constant of approximately twice that of FR-5. TGG is also available commercially. Other materials which may be used include YIG (yttrium-iron-garnet), BSO (bismuth-silicon-oxide), BIG (bismuth substituted iron-garnets) and RIG (rare earth substituted iron-garnets).

The quarter wave plate 18 is used to bias the interferometer for maximum sensitivity. Instead of a quarter wave plate 18, a linear analyzer could be utilized.

With the arrangement of FIG. 1 the output of the optical detector 23 is in accordance with equation 2 but a constant signal of this type is difficult to process so a carrier signal is provided which is modulated in amplitude by I and in phase by $\Delta\Phi$. A convenient method of applying this modulation is to use a laser diode as the light source 10 and to vary the frequency of the light by means of a sawtooth waveform obtained from a signal generator 25 (FIG. 2) applied to the laser. Since the wavelength of the light from the light source 10 changes, the lengths of the arms of the interferometer, when measured in wavelengths, also change. Provided the lengths of the arms are slightly different, the signal received by the optical detector 23 is amplitude modulated by the intensity I of equation 2 and its phase in relation to the output of the signal generator 25 depends on the phase difference $\Delta\Phi$. Other frequencies are generated during the flyback period of the sawtooth waveform and a bandpass filter 26 is used to select the modulated frequency. Filter 26 is connected to a lock-in amplifier 27 which also receives a reference signal from the signal generator 25. The amplifier 27 acts as a demodulator to provide a signal proportional to the amplitude of the signal from the filter 26, this amplitude being proportional to I of equation 2 and therefore proportional to magnetic field intensity surrounding the Faraday sensing element 16 and temperature. The lock-in amplifier 27 also acts as a phase detector providing a signal proportional to the difference in phase between its two input signals and therefore proportional to the temperature of Faraday sensing element 16. These amplitude and phase signals are applied to a microcomputer 28 programmed to compensate the signal proportional to amplitude for temperature variations and to provide an output representative of the magnetic field surrounding the Faraday sensing element 16. The computer stores a previously obtained calibration of the Verdet constant in relation to temperature for the material of the Faraday sensing element 16. Having derived the temperature, It uses the calibration to derive the Verdet constant and then magnetic field intensity from the Verdet constant. The calibration may be in the form of a look-up table or an equation. Thus a signal representative of temperature may also be provided. Clearly when the magnetic field depends on an electric current, the field signal is proportional to current.

An alternative way of modulating the signal at the optical detector 23 is to mount the mirror 19 on a piezoelectric cylinder so that its position in relation to the quarter wave plate 18 can be varied by applying a sawtooth waveform to the cylinder. With such an arrangement the same method of signal processing can be used but it is not necessary for the two arms of the interferometer to be of different lengths. In both these arrangements the optimum operating point Is obtained from the interferometer by biasing It using the quarter wave plate 18 in one arm such that the azimuth of the recombining beams are at 45° with respect to each other. Subsequent azimuth modulation of one of the linear states gives rise to maximum rate of change of visibility of the fringes. The quarter wave plate can be replaced by a linear analyzer, that is a polaroid element orientated such that it rotates polarization by 45°.

A sinusoidal variation in light frequency or mirror position may be used as an alternative to the sawtooth waveform but other arrangements for signal processing are then required.

For higher frequency applications than can be obtained with a laser diode, a Bragg cell can be positioned between a laser providing constant frequency light and the beam splitter. The Bragg cell also receives a signal from the signal generator 25 and produces two light beams, one at the frequency of the laser light and one at the same frequency plus or minus the frequency of the signal from the signal generator 25. The difference of frequency between the two beams is modulated by the interferometer and the output received at the optical detector 23 is processed in the same way.

The sawtooth frequency or mirror position variation techniques are pseudo-heterodyne arrangements, the Bragg cell technique is a true heterodyne arrangement and an active homodyne alternative is now mentioned. Variations in the output of the optical detector 23 may be used as an error signal in a servo system which changes the frequency of the light from the light source 10 to tend to reduce the variations. If the servo system has a low bandwidth, the control signal of the servo represents temperature change while the output from the optical detector 23 represents magnetic field intensity. With a wide bandwidth servo, the control signal contains both "magnetic field" signals and "temperature" signals which can be separated by virtue, usually, of separate ranges of frequency variation.

Results obtained for temperature sensing with the arrangement of FIGS. 1 and 2 are shown in FIG. 3. For these results the mirror 19 was mounted on a piezoelectric cylinder driven by a voltage from the signal generator 25. This enabled pseudo-heterodyne signal processing to be implemented. A solenoid coil (not shown) was placed around the Faraday sensing element 16 to allow test fields to be applied. FIG. 3 shows the electric current, measured from the visibility modulation, and temperature plotted against time. Initially the current to the coil was changed whilst holding the temperature constant. The temperature was then increased by ~60° C. and the measured current decreased while applied current was kept constant. Compensation for the temperature dependence of $V(\lambda,T)$ is shown by the dashed line 30.

Since $\cos\Delta\Phi$ in equation 2 repeats every $2\pi$ the temperature indication mentioned above is ambiguous. Some ways in which this ambiguity can be resolved will now be outlined. If the interferometer is Illuminated using a broad band, or "white light" source, fringes are only observable when the optical path length differences between the two recombining beams are almost identical, that is within the coherence length of the source which is typically a few microns. In the system described above temperature changes in the sensing element 16 change the relative optical path lengths and the technique of a remote balancing interferometer can be used to recover the temperature change but amplitude modulation of the visibility is still used to recover the magnetic field signal as described above. In a remote balancing interferometer a signal dependent on the intensity of the fringes is derived and is used to maintain maximum fringe intensity by movement of a mirror equivalent to one of the mirrors 17 and 19. The signal used for driving this mirror is representative of temperature and may be used for this purpose, and for compensating the intensity signal. The balancing interferometer is described by R. Jones, M. Hazell and R. Welford in "A Generic Sensing System Based on Short Coherence Interferometer", SPIE 1314. 315, 1990. Other possible techniques which may possibly be applied in resolving the temperature ambiguity are described in two further papers: firstly "Dual Wavelength Approach to Interferometric Sensing" by A. D. Kersey and A. Dandridge, SPIE 7898. 176, 1987; and "Partially Coherent Sources in Interferometric Sensors" by S. A. Al-Chalabi, B. Culshaw and D. E. N. Davis, Proc. First. Int. Conf. on Optical Fibre Sensors, IEE Conference Publication 221,132, London 1983.

The primary use of the invention is expected to be for current measurement and the sensing element 16 then has to be positioned in the magnetic field due to the current. The sensing element 16 may simply form one or more turns round a conductor carrying the current or the element in the form of an optical fiber may be in the form of one or more turns around the conductor. Another possibility is to construct a closed optical circuit using the sensing element 16 and therefore utilize the advantages offered from Ampere's law, that is insensitivity to conductor position within the optical circuit and immunity to fields from surrounding conductors. The optical circuit can be made from glass blocks or rods forming the sides of a hollow rectangle with the conductor passing through the rectangle. Light from the beam splitter enters one rod or block axially at a corner of the rectangle and is reflected at the corners of the rectangle by mirrors or a diagonal interface so that it follows the sides until it reaches the entry corner where it is reflected by a mirror back along its incoming path. In an alternative arrangement the sensing element 16 may be only a few centimeters long and positioned in the air gap of a magnetic core surrounding a conductor.

It will be apparent that the invention can be put into effect in many other ways than those specifically described. For example other methods of providing a modulated carrier signal, or equivalent, may be used, as may other methods for resolving the temperature measurement ambiguity. Other interferometers such as the Fabry-Perot or Mach-Zehnder interferometer, or modifications thereof, may be used instead of the Michelson interferometer. If a Fabry-Perot interferometer were used, this would involve alteration of the optical arrangement shown in FIG. 1 as follows. The mirror 19 would be replaced by a partially reflecting surface on that end of the Faraday sensing element 16 closest to the beam splitter 15. The quarter wave plate 18 would be moved from its position shown in FIG. 1 and placed between the sensing element 16 and the mirror 17. In operation, light would recombine from reflections at the partially reflecting surface and at the mirror 17. The interferometer is thus configured as a remote low finesse Fabry-Perot interferometer. In practice, the interferometer might be made as an integral unit, in which case the quarter wave plate 18 would be glued to the sensing element 16, the mirror 17 would take the form of a reflective surface applied to the quarter wave plate, and this whole assembly would be glued to the beam splitter 15 via the partially reflecting surface.

Light from the source may be elliptically polarized when the above described methods may be used, with some modification. As another alternative light from the source may be circularly polarized when, it can be shown, the phase change in the sensing element is dependent on both the Verdet constant and temperature but not the amplitude of the intensity. In general the phase or frequency change due to the Verdet constant is different from that due to temperature so signals representative of the former can usually be separated from those representative of the latter allowing correction of the Verdet constant for temperature.

I claim:

1. Apparatus for sensing or measuring a magnetic field comprising:
    a light source for generating light having at least a component which is polarized;
    a sensing element arranged to transmit light from the light source and comprising material having a Verdet constant which depends on a temperature of the material;
    means for combining light from the light source with light from the sensing element to form an interference pattern;
    means for providing a signal representative of an intensity of light combined by the means for combining light; and
    means for deriving first and second signals dependent on the Verdet constant of the material and the temperature thereof, respectively, from the signal representative of the intensity of light;
    whereby an intensity of a magnetic field at the sensing element, substantially independent of temperature, can be derived.

2. Apparatus according to claim 1, wherein the means for deriving the first and second signals comprises:
    means for deriving the first signal as a signal representative of an amplitude of fringes of the interference pattern; and
    means for deriving the second signal as a signal representative of a change in phase of polarized light from the light source due to transmission through the sensing element.

3. Apparatus according to claim 1 or 2, wherein the means for combining comprises a Michelson interferometer and light from the light source is substantially all linearly polarized.

4. Apparatus according to claim 1, including means for deriving a signal representative of the magnetic field at the sensing element from the first and second signals.

5. Apparatus for sensing or measuring a magnetic field comprising:
    a light source for generating light having at least a component which is polarized;
    a sensing element arranged to transmit light from the light source and comprising material having a Verdet constant which depends on a temperature of the material;
    means for combining light from the light source with light from the sensing element to form an interference pattern;
    means for providing a signal representative of an intensity of light combined by the means for combining light;

means for deriving first and second signals dependent on the Verdet constant of the material and the temperature thereof, respectively, from the signal representative of the intensity of light;

means for modulating a carrier signal with said intensity of light; and demodulating means for amplitude demodulating the carrier signal to derive said first signal and for phase demodulating the carrier signal to derive said second signal;

whereby an intensity of a magnetic field at the sensing element, substantially independent of temperature, can be derived.

6. Apparatus according to claim 5, wherein the means for modulating comprises:

means for generating a cyclically varying signal; and means for varying a frequency of the light source according to the cyclically varying signal;

the demodulating means being coupled to receive the cyclically varying signal as a reference signal for phase demodulating the carrier signal.

7. Apparatus according to claim 5, wherein:

the means for modulating comprises:

means for generating a cyclically varying signal; and a Bragg cell interposed between the light source and the means for combining light, with the means for generating the cyclically varying signal coupled thereto;

the demodulating means being coupled to receive the cyclically varying signal as a reference signal for phase demodulating the carrier signal.

8. Apparatus according to claim 1, wherein said material of the sensing element has a high Verdet constant.

9. Apparatus according to claim 1, wherein said material is chosen from a group consisting of:

FR-5 glass,
terbium-gallium-garnet,
yttrium-iron-garnet,
bismuth-silicon-oxide,
bismuth substituted iron-garnets, and
rare earth substituted iron-garnets.

10. Apparatus according to claim 1 or claim 8 or 9, wherein:

the light source generates circularly polarized light; and the means for deriving first and second signals comprises:

means for deriving the first signal as a signal dependent on a change of phase of light from the light source which occurs on transmission through the sensing element due to the Verdet constant of said material, and means for deriving the second signal as a signal dependent on a change of phase of light from the light source which occurs on transmission through the sensing element due to the temperature of said material.

11. Apparatus for sensing or measuring electric current comprising apparatus according to claim 1, wherein the sensing element is arranged, adapted or positioned to be subject to a magnetic field due to an electric current which is to be sensed or measured.

12. Apparatus according to claim 11, wherein the sensing element is such that, in operation, it can be used in one of the following configurations:

with a conductor carrying said current arranged as one or more turns around the sensing element;

with the sensing element arranged as one or more turns around a conductor carrying said current; and with the sensing element positioned in a gap in a magnetic core which surrounds a conductor carrying said current.

13. Apparatus according to claim 11, wherein the sensing element is arranged as an optical circuit comprising a solid portion of said material surrounding a conductor carrying said current, the solid portion of said material forming a polygon having a plane at an angle to the conductor.

14. Apparatus according to claim 1, including means for at least partially resolving any ambiguity in the second signal in relation to an indication of temperature thereby.

15. Apparatus according to claim 14, wherein:

the means for combining comprises a Michelson interferometer;

the light source is relatively broad band and the Michelson interferometer is a balancing interferometer in which a control signal is developed which is used to maximize an intensity of fringes of the interference pattern generated by the Michelson interferometer; and the means for resolving error employs the control signal to provide, at least partially, an indication of the temperature of the sensing element.

16. Apparatus according to claim 2 or claim 8 or 9, wherein:

the light source is relatively broad band; and the means for combining comprises a balancing interferometer in which a control signal is developed which is used to maximize the intensity of the fringes of the interference pattern generated by the interferometer; and the means for deriving the second signal includes means for generating the control signal, the control signal being representative of said change in phase.

17. A method of sensing or measuring magnetic field intensity comprising the steps of:

generating light having at least one component which is polarized;

transmitting the generated light through a sensing element in the magnetic field, the sensing element comprising material having a Verdet constant which depends on a temperature of the material;

combining the generated light with light from the sensing element to form an interference pattern;

providing a signal representative of the intensity of light so combined; and deriving first and second signals dependent on the Verdet constant of the material and the temperature thereof, respectively, from the signal representative of the intensity of light, whereby the intensity of the magnetic field at the sensing element, substantially independent of temperature, can be derived.

18. A method according to claim 17, including a step of deriving a signal representative of the magnetic field at the sensing element from the first and second signals.

19. A method of sensing or measuring magnetic field intensity, comprising steps of:

generating light having at least one component which is polarized;

transmitting the generated light through a sensing element in the magnetic field, the sensing element comprising material having a Verdet constant which depends on a temperature of the material;

combining the generated light with light from the sensing element to form an interference pattern;

providing a signal representative of the intensity of light so combined; and deriving first and second signals dependent on the Verdet constant of the material and the temperature thereof, respectively, from the signal representative of the intensity of light, whereby the intensity of the magnetic field at the sensing element, substantially independent of temperature, can be derived;

deriving a signal representative of the magnetic field at the sensing element from the first and second signals;

modulating a carrier signal with said intensity of light;

amplitude demodulating the carrier signal to derive said first signal; and phase demodulating the carrier signal to derive said second signal.

20. A method for sensing or measuring electric current using the method of any one of claims 17 to 18, wherein the sensing element is subject to a magnetic field due to an electric current which is to be sensed or measured.

21. Apparatus for measuring temperature comprising apparatus according to claim 1, further comprising means for indicating the temperature of the material in dependence on the second signal.

22. Apparatus for sensing or measuring a magnetic field comprising:

a light source for generating light having at least a component which is polarized, light from the light source being substantially all linearly polarized;

a sensing element arranged to transmit light from the light source and comprising material having a Verdet constant which depends on a temperature of the material;

means for combining light from the light source with light from the sensing element to form an interference pattern, wherein the means for combining comprises a Michelson interferometer;

means for providing a signal representative of an intensity of light combined by the means for combining light;

means for deriving first and second signals dependent on the Verdet constant of the material and the temperature thereof, respectively, from the signal representative of the intensity of light;

means for deriving a signal representative of the magnetic field at the sensing element from the first and second signals;

means for modulating a carrier signal with said intensity of light, said means for modulating comprising:

means for generating a cyclically varying signal, and means for varying a length of one arm of the Michelson interferometer according to the cyclically varying signal;

means for amplitude demodulating the carrier signal to derive said first signal and for phase demodulating the carrier signal to derive said second signal, the demodulating means being coupled to receive the cyclically varying signal as a reference signal for phase demodulating the carrier signal;

whereby an intensity of a magnetic field at the sensing element, substantially independent of temperature, can be derived.

23. A method of sensing or measuring magnetic field intensity, comprising steps of:

generating light having at least one component which is polarized;

transmitting the generated light through a sensing element in the magnetic field, the sensing element comprising material having a Verdet constant which depends on a temperature of the material;

subjecting the sensing element to a magnetic field due to an electric current which is to be sensed or measured;

combining the generated light with light from the sensing element to form an interference pattern;

providing a signal representative of the intensity of light so combined; and deriving first and second signals dependent on the Verdet constant of the material and the temperature thereof, respectively, from the signal representative of the intensity of light, whereby the intensity of the magnetic field at the sensing element, substantially independent of temperature, can be derived;

deriving a signal representative of the magnetic field at the sensing element from the first and second signals;

modulating a carrier signal with said intensity of light;

amplitude demodulating the carrier signal to derive said first signal; and phase demodulating the carrier signal to derive said second signal.

* * * * *